(12) United States Patent
Sezginer et al.

(10) Patent No.: US 8,122,389 B2
(45) Date of Patent: Feb. 21, 2012

(54) APPARATUS AND METHOD FOR SEGMENTING EDGES FOR OPTICAL PROXIMITY CORRECTION

(75) Inventors: Abdurrahman Sezginer, Los Gatos, CA (US); Bayram Yenikaya, Sunnyvale, CA (US); Hsu-Ting Huang, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 12/690,791

(22) Filed: Jan. 20, 2010

(65) Prior Publication Data

US 2010/0186000 A1   Jul. 22, 2010

Related U.S. Application Data

(62) Division of application No. 11/203,498, filed on Aug. 13, 2005, now Pat. No. 7,743,358.

(60) Provisional application No. 60/676,136, filed on Apr. 29, 2005.

(51) Int. Cl.
  *G06F 17/50* (2006.01)
(52) U.S. Cl. .......................................................... 716/51
(58) Field of Classification Search .................... 716/53, 716/51
  See application file for complete search history.

(56) References Cited

U.S. PATENT DOCUMENTS

| 5,680,588 A * | 10/1997 | Gortych et al. ................. 430/30 |
| 6,539,521 B1 * | 3/2003 | Pierrat et al. .................... 716/53 |
| 6,978,438 B1 * | 12/2005 | Capodieci ....................... 716/53 |

* cited by examiner

*Primary Examiner* — Jack Chiang
*Assistant Examiner* — Brandon Bowers
(74) *Attorney, Agent, or Firm* — Kenyon & Kenyon LLP

(57) ABSTRACT

An apparatus and method for modifying a mask data set includes calculating a derivative of a figure-of-merit, indicative of a data set defined by a plurality of polygon edges and then segmenting polygon edges in response to said step of calculating.

36 Claims, 8 Drawing Sheets

APPARATUS AND METHOD FOR SEGMENTING EDGES FOR OPTICAL PROXIMITY CORRECTION

RELATED APPLICATIONS

This application is a divisional of and claims the benefit of U.S. patent application Ser. No. 11/203,498 filed Aug. 13, 2005 now U.S. Pat. No. 7,743,358, which is hereby incorporated herein by reference in its entirety. This application also claims the benefit of U.S. patent application Ser. No. 60/676, 136, entitled "Apparatus and Method for Optical Proximity Correction", filed Apr. 29, 2005, and is related to U.S. utility patent application Ser. No. 11/203,505, now U.S. Pat. No. 7,480,891, entitled "Method and Apparatus of Model-Based Photomask Synthesis", filed Aug. 13, 2005, and U.S. utility patent application Ser. No. 11/203,522, now U.S. Pat. No. 7,506,300, entitled "Apparatus and Method for Breaking Up and Merging Polygons", filed Aug. 13, 2005, which related applications are incorporated herein by reference as though fully set forth and which applications are also claim priority from U.S. patent application Ser. No. 60/676,136. Elements of the inventions disclosed in these aforementioned patents can be used separately or in combination with each other.

BACKGROUND

There have been many different kinds of methods and systems for optical proximity correction disclosed in the prior art. Nevertheless, there is a need for a new and improved apparatus and method for optical proximity correction that facilitates a more accurate and reliable optical proximity correction process as applied to integrated circuits with sub-light wavelength structures.

BRIEF SUMMARY OF THE INVENTION

The preferred embodiment of the present invention is directed to an apparatus and method for modifying a mask data set which includes calculating a derivative of a figure-of-merit, indicative of a data set defined by a plurality of polygon edges and then segmenting polygon edges in response to said step of calculating.

DETAILED DESCRIPTION OF THE PREFERRED EMBODIMENTS

As will be described hereinafter in greater detail, a method of optimally segmenting edges of polygons in a photomask data set according to a computational model of pattern transfer is provided. The method includes providing a computational model of patterning, defining design goals, providing a method of calculating a figure-of-merit indicative of how well a mask data set meets design goals according to the computational model, calculating the derivative of the figure-of-merit with respect to a mask function, segmenting polygon edges according to the derivative of the figure-of-merit, moving edge segments to substantially maximize the figure-of-merit, repeating the steps of segmenting and moving iteratively. In short, an apparatus and method of modifying a lithography data set is disclosed. In this regard, the following description is presented to enable any person skilled in the art to make and use the invention. For purposes of explanation, specific nomenclature is set forth to provide a thorough understanding of the present invention. Descriptions of specific applications and methods are provided only as examples. Various modifications to the preferred embodiments will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and steps disclosed herein.

Figure 1:
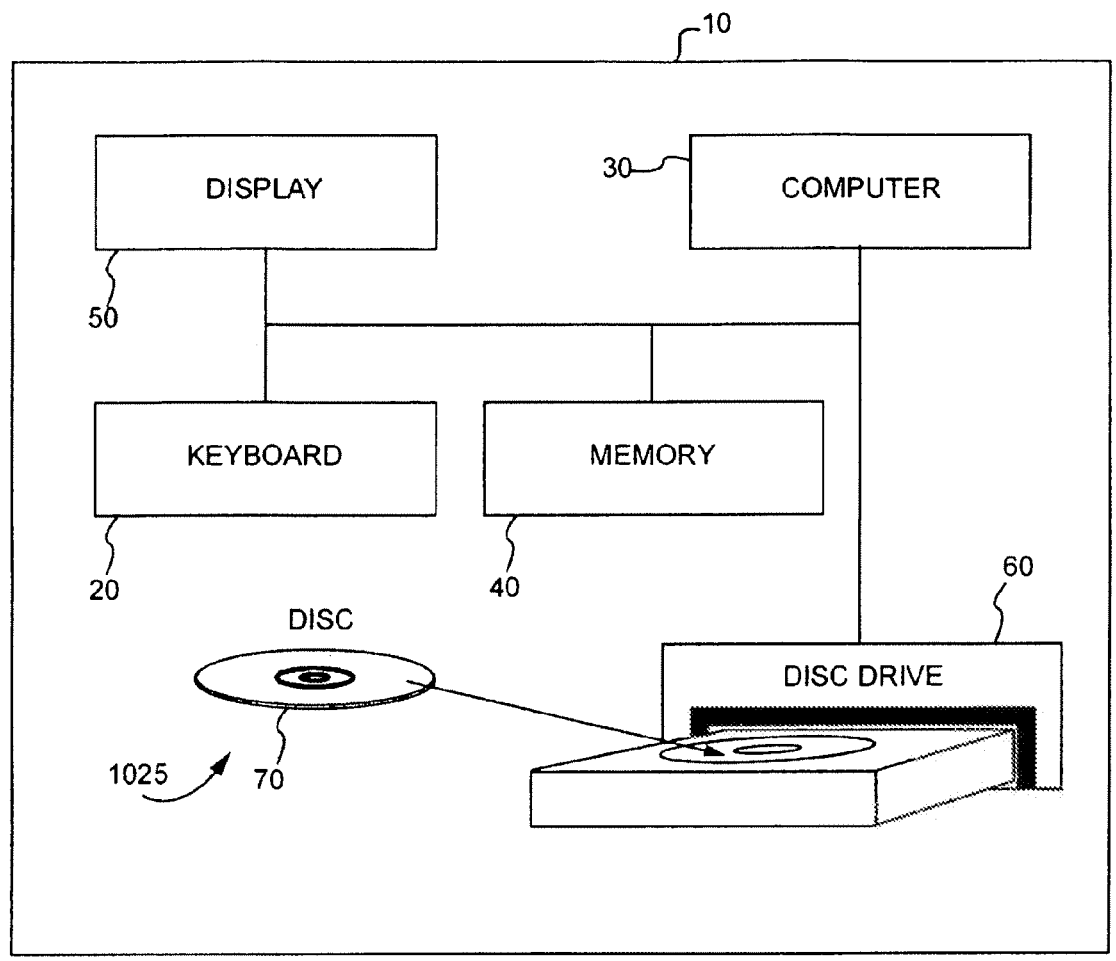
FIG. 1 is a diagrammatic illustration of a computer-aided design system, which is constructed in accordance with an embodiment of the present invention.
Figure 4:
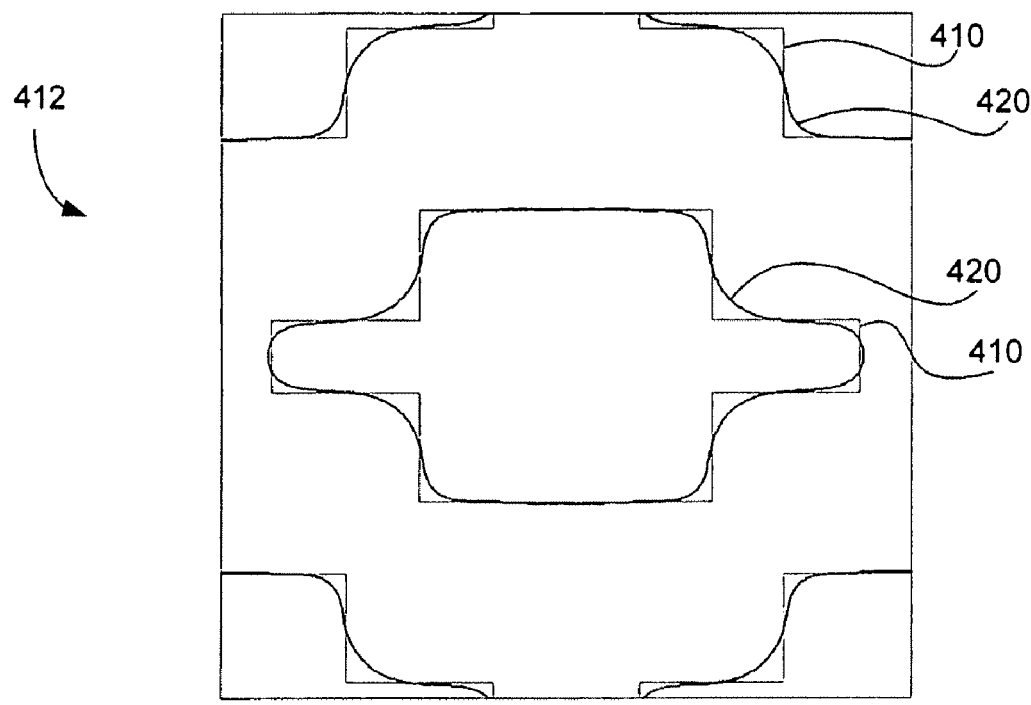
FIG. 4 is a diagrammatic illustration of a plurality of edges of a photoresist image in the plane of the wafer superimposed on a target pattern.

Referring now to the drawings and more particularly to FIGS. 1 and 4, there is illustrated a CAD system 10 which executes a method of segmenting polygon edges in a photomask design in accordance with a preferred embodiment of the present invention. The CAD system 10 implements several different and unique methods of optical proximity correction which includes the method 1025 of segmenting polygon edges in a photomask design. As will be explained hereinafter in greater detail, the method 1025 of segmenting polygon edges for improving a photomask design is provided on a computer program product 70, which is a computer usable medium that has encoded thereon computer readable codes. The computer readable codes enable a user, via the CAD system 10, to apply the method 1025 of segmenting polygon edges to a photomask design. In this regard, the computer readable code causes the CAD system 10 to take the following actions:

a) to calculate a derivative of a figure-of-merit which is indicative of a data set defined by a plurality of polygon edges; and b) to segment an individual one of the plurality of polygon edges to facilitate improving a photomask design.

Before discussing the preferred embodiment of the present invention in greater detail, it may be beneficial to briefly review the background art and then define a few of the terms utilized in this disclosure to help with understanding the uniqueness and novelty of the present invention.

Very large-scale integrated circuits are patterned using sub-wavelength optical lithography, wherein critical dimensions of patterns are less than the wavelength of the exposing light. For example, an ArF excimer laser source of 193 nm wavelength can be used to print 65 nm-wide lines.

In sub-wavelength lithography, the pattern on a photomask is significantly distorted upon projection on to a wafer. Model-based optical proximity correction (MOPC) is a method of synthesizing a mask pattern that will produce a predetermined target pattern on the wafer as faithfully as possible in the presence of the distortions inherent to the patterning process. The target pattern, that is, the pattern desired on the wafer, is generated by circuit design, signal-timing, layout, and routing considerations. The target pattern is represented by a set of polygons.

MOPC uses a computational model of the patterning process. Typically, the computational model includes a physical-optics calculation of image formation and a model of the blur caused by molecular diffusion in the photoresist. MOPC starts with an initial guess of the photomask data, which is a set of polygons. For binary and attenuated-PSM (attenuated phase-shift mask) masks, the initial guess is similar to the target pattern. MOPC iteratively adjusts the polygons in the photomask data set in order to minimize some measure of the difference between the target pattern and the pattern predicted by the model. Adjusting the polygons is usually done by moving their edges.

Edges are typically subdivided into segments and the segments are moved independently in MOPC. Segmenting the edges of a polygon increases the degrees of freedom by which the shape of a polygon can be changed. Segmenting the edges enables searching the optimal photomask data set in a larger dimensional space, which in turn enables meeting the design goals better.

The cost of writing a mask with a vector shaped e-beam writer is an increasing function of the number of segments. Since every segment adds to the cost of handling the mask data and writing the mask, edges need to be segmented judiciously so that every segment introduced has maximal impact towards meeting the design goals.

In the prior art, segmentation is performed according to a set of geometric rules. The rules include inserting a predetermined number of segments of predetermined lengths at the corners; segmenting edges with a predetermined segment length; inserting segmentation points on an edge by orthogonally projecting neighboring vertices onto the edge. For example, see "Flexible Fragmentation Rules for Next-Generation OPC: Tag Prior to Fragmentation", by Shih-Ying Chen, Eric C. Lynn, Proc. SPIE Vol. 4691, 1221-1231, Optical Microlithography XV, July 2002.

The present invention is also applicable to mask-less lithography, wherein the photomask is replaced by a spatial light modulator. The spatial light modulator has an array of pixels each of which can modulate light that falls on it. The pixels are controlled according to the photomask data. The spatial light modulator typically comprises an array of micromachined mirrors. The spatial light modulator is illuminated and its image is projected by an objective on to the wafer (see: U.S. Pat. No. 6,700,095 by Sandstrom, et al., 2004). In view of the foregoing, in the discussion that follows, the terms "photomask data" set and "mask layout" are used synonymously and they are understood to include "mask-less lithography data set."

Several unique terms will be utilized in this specification. The following will define those terms.

Mask function m(x, y) maps the 2-dimensional (x, y) surface of the photomask to its complex-valued, local Fresnel transmission or reflection coefficient. This description includes the special case of a real-valued mask function. The mask function assigns an amplitude and a phase shift to each point (x, y) on the surface of the photomask. Usually, light that is transmitted through the photomask is projected on to a photoresist layer. In the transmission mode, the amplitude of the mask function indicates how transparent the photomask is at any point on the photomask. The larger the amplitude, the more transparent is the photomask. In some photolithography instruments, light that is reflected off a photomask is projected on to a photoresist layer. In the reflective mode, the amplitude of the mask function indicates the reflectivity of the photomask. The larger the amplitude, the more reflective is the photomask. The phase of the mask function indicates the phase shift the photomask imparts to light that is projected from a particular region of the photomask. This concept of a mask function m(x, y) is consistent with the Kirchhoff approximation (due to Gustav Kirchhoff 1824-1887) which describes diffraction as an approximately local phenomenon. A local phenomenon means, the electromagnetic field reflected by or transmitted through the mask at the point (x, y) on the photomask is influenced only by the illuminating wave and a local property m(x, y) of the mask at the same point. The local property m(x, y) is the transmission or reflection coefficient of the film stack on the photomask at point (x, y). The film stack includes any etched layer of the fused silica substrate of the photomask and thin films of materials such as $SiO_2$, TiN, MoSi, Cr deposited on the photomask. The film stack on the photomask is position-dependent since a pattern is etched on the photomask. The film stack is specified by optical refractive index, extinction coefficient, and thickness of each film, and the order of the films on the photomask. The transmission or reflection coefficient at (x, y) is calculated by assuming that the film stack at (x, y) extends endlessly in the plane of the photomask. Calculation of the transmission or reflection coefficient of a layered medium is well known (See: J. A. Kong, Electromagnetic Wave Theory, Section 3.4.C, EMW Publishing, Cambridge, Mass., 2000).

A piece-wise constant mask function is one that can be expressed as a finite summation of products of complex numbers $(m_j)$ and characteristic functions $K_{Polygon_j}$ of polygonal regions ($Polygon_j$):

$$m(x, y) = \sum_{j=1}^{N_P} m_j K_{Polygon_j}(x, y) \tag{1}$$

Characteristic function $K_\Omega$ of set $\Omega$ maps the interior of $\Omega$ to 1 and the exterior of $\Omega$ to 0.

A photolithography data set, synonymously called a photomask data set and mask layout, describes a piecewise-constant mask function. A photomask data set comprises a set of polygons wherein the mask function is substantially constant in each polygon. The photomask data set comprises (x, y) coordinates of the vertices of each polygon $Polygon_j$, and the value of the mask function in the polygon or an index which determines the value of the mask function in the polygon. In Equation 1, the value of the mask function in the $j^{th}$ polygon is $m_j$, if the $j^{th}$ polygon does not intersect any other polygon.

A target pattern is the pattern we would like to form on the wafer. The target pattern is represented by a set of target polygons. Target polygons remain invariant during optimization of the photomask. Target points are points selected on the target polygons. Design goals are enforced at the target points.

A functional is a noun in mathematics. In general, a functional is a map of a topological vector space into its scalar field. In the context of this invention, a functional maps the mask function, or a photomask data set, to a real number, which serves as a figure-of-merit of the design. The figure-of-merit is a single number that measures how well a design goal, or a desired compromise between multiple goals, is met. Equivalently, a figure-of-demerit can be used which decreases as the design goals are approached. The photomask design problem is thus reduced to maximizing a figure-of-merit or minimizing a figure-of-demerit. When we mention only one of the terms: figure-of-merit and figure-of-demerit, it is understood that either formulation is possible, and that minimizing a figure-of-demerit and maximizing a figure-of-merit are equivalents of one another.

A Fréchet derivative is the rate of change in the value of a functional with respect to changes in the function on which the functional operates. The Fréchet derivative of a functional F is a linear functional T (See W. Rudin, "Functional Analysis," Definition 10.34. Mc-Graw Hill, 1973) and as such, it can be represented by an inner-product with a function $$\frac{\delta F}{\delta m} : \lim_{\|\delta m\| \to 0} \frac{F(m + \delta m) - Fm - T\delta m}{\|\delta m\|} = 0 \quad (2)$$

$$T\delta m = \left\langle \frac{\delta F}{\delta m}, \delta m \right\rangle$$

In Equation 2, $\delta m$ is an arbitrary perturbation in the mask function, the perturbation having a small norm. We shall call the function $$\frac{\delta F}{\delta m}$$

the Fréchet derivative of the functional F ignoring the distinction between a linear functional and the function that represents a linear functional.

Figure 2:
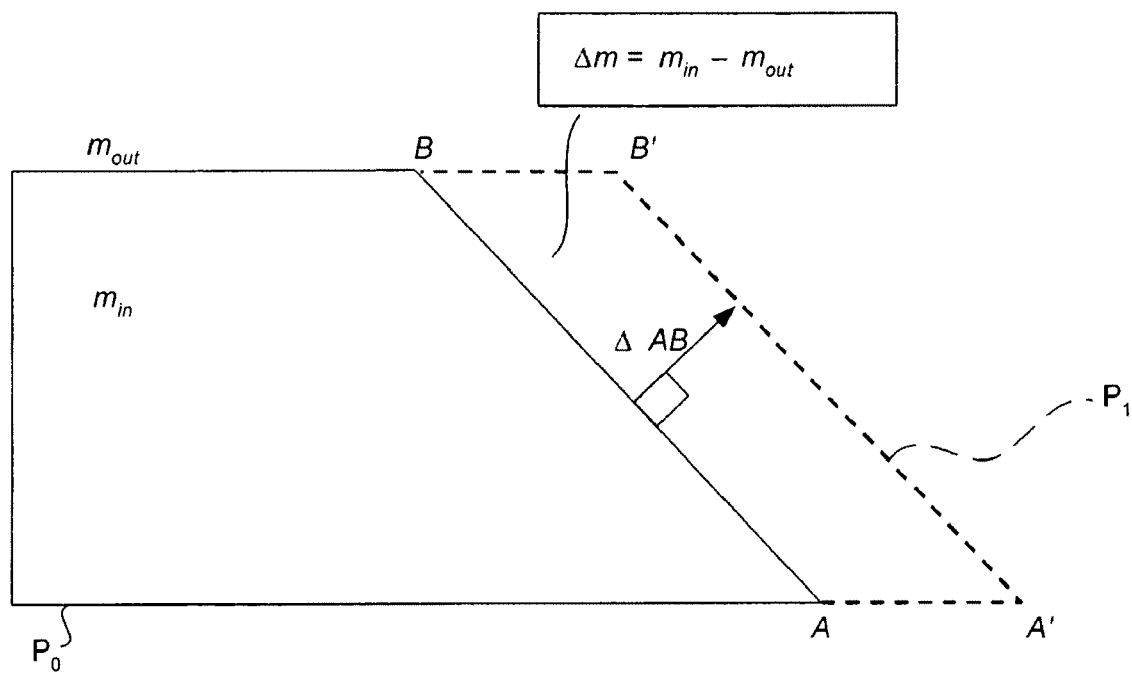
FIG. 2 is a diagrammatic illustration for helping to explain the definition of moving an edge in a polygon.

Referring now to FIG. 2, moving an edge AB of a polygon $P_0$ refers to transforming polygon $P_0$ into another polygon $P_1$ such that: there is a one-to-one correspondence between the edges of polygon $P_0$ and the edges of polygon $P_1$; each edge of polygon $P_0$ is parallel to the corresponding edge of polygon $P_1$; the distance between AB and the corresponding edge A'B' of $P_1$ is called the edge movement $\Delta_{AB}$; and the distance between any edge of polygon $P_0$ other than AB, and the corresponding edge of polygon $P_1$, is zero. FIG. 2 shows the transformation of one polygon, polygon $P_0$ into another polygon $P_1$ by an edge movement.

Moving edges of a polygon refers to transforming the polygon into another polygon such that the transformation is a composition of any number of transformations, wherein each transformation is moving an edge. The composition of the transformations is represented by a vector or array of edge movements, $\Delta$.

Figure 3A:
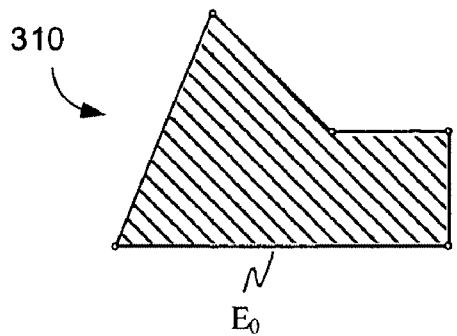
FIGS. 3A-C are a diagrammatic illustration for helping to explain the definition of segmentation of an edge of a polygon.
Figure 3B:
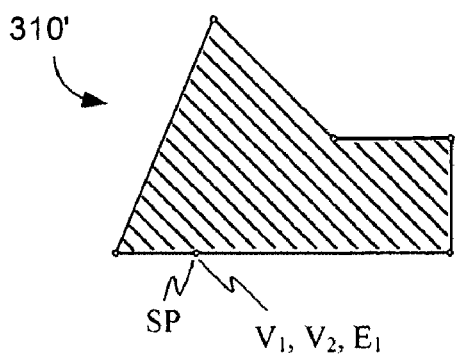
Figure 3C:
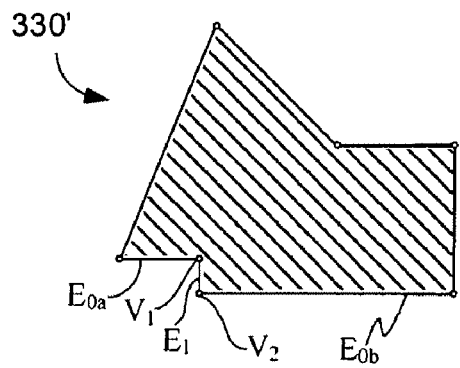

Segmenting an edge of a polygon refers to transforming a polygon 310 into another polygon 310' with a larger number of vertices. Referring to FIG. 3, segmenting comprises inserting two overlapping vertices $V_1$ and $V_2$, between which is an edge of zero-length $E_1$, at a segmentation point SP on an edge $E_0$ of the polygon 310'. Immediately after segmentation, the segmented polygon has at least four colinear vertices and at least two overlapping vertices ($V_1$ and $V_2$). Segment or edge segment is synonymous with "edge" of a polygon. Segment usually refers to edges created by segmenting an edge, such as $E_{0a}$, $E_{0b}$, and $E_1$. The segmented polygon 310' is usually further transformed by moving its edges, as illustrated in FIG. 3C, to form the transformed polygon 330'. The purpose of segmenting the edges of a polygon is to increase the degrees of freedom by which the polygon can be transformed into another polygon.

The target pattern, mask layout, and the pattern printed on the wafer (wafer pattern) are distinct objects. The target points used for enforcing design goals are on the target polygons. The target polygons and target points are invariant during iterations of photomask synthesis. The edges of the polygons in the mask layout are segmented and moved. The segmentation points have no relation to the target points.

Considering now a method of synthesizing mask data, MOPC adjusts a photomask data set so that the pattern that is transferred to the wafer by lithography is as close as possible to a target pattern. An essential ingredient of model-based lithography is a computational model of the patterning process. The intensity of the latent image in a photoresist film deposited on a wafer can be expressed as:

$$I(x, y; z) = \sum_{n=1}^{N} \mu_n \left| \int \int V_n^*(x' - x, y' - y; z) m(x', y') dx' dy' \right|^2 \quad (3)$$

(See: N. Cobb et al., "Mathematical and CAD Framework for Proximity Correction," Proc. SPIE Vol. 2726, p. 208, 1996) In Equation 3, which is derived from the Kirchhoff approximation, $\mu_1, \mu_2, \ldots, \mu_N$ are positive-valued eigenvalues and $V_1^*$, $V_2^*, \ldots, V_N^*$ are complex conjugates of eigenfunctions of a Hermitian, positive-semidefinite operator; and m(x, y) is the complex transmission coefficient of the mask at the point (x, y). For binary masks, m(x, y)=1 in clear areas, and m(x, y)=0 in opaque areas. In 180° phase-shifted windows on the photomask, m(x, y)=−1. In general, in a $\phi$-radian phase-shifted window, m(x, y)=$e^{i\phi}$. For an attenuated phase-shift feature with power transmission coefficient T, the mask function takes the value: m(x, y)=$e^{i\phi}\sqrt{T}$ wherein the nominal value of the phase shift is: $\phi=\pi$. For reflective masks, m(x, y) is the complex reflection coefficient of the mask at the position (x, y). The focus variable z, denotes the axial position of the wafer with respect to best focus. The variable z is not to be confused with the vertical position inside the photoresist.

The goals of photomask design are encapsulated in a real-valued figure-of-merit, or equivalently in a figure-of-demerit, which is calculated using the results of the computational model of the patterning process. The photomask design problem thus becomes equivalent to minimizing a figure-of-demerit or maximizing figure-of-merit.

The goals of photomask design include one or more of:
1. placing the edges of the printed pattern on the corresponding edge of a target pattern;
2. maximizing the image contrast at the resist edge thereby increasing the exposure dose latitude and immunity to flare;
3. maximizing the depth of focus, i.e., enforcing 1 and 2 for a range of focus values.

The first two mentioned goals can be achieved by minimizing a functional $F_1 m$ with respect to lithography data (mask transmission function) m:

$$F_1m = \sum_{q=1}^{Q} \sum_{j=1}^{M} (I(x_j, y_j; z_q) - t)^2 \qquad (4)$$

$F_1$ is a functional that maps a mask transmission function m to a non-negative real number, which is a figure-of-demerit. In Equation 4, t denotes a threshold, which is equal to the ratio: (dose-to-clear/dose), where "dose" refers to the light exposure dose (energy per unit area) applied to a photoresist, and "dose-to-clear" indicates the minimum dose necessary to clear a positive photoresist or not clear a negative photoresist. Accordingly, a positive photoresist dissolves if $I(x_j, y_j; z_q) > t$, and it does not dissolve if $I(x_j, y_j; z_q) < t$ at the location $(x_j, y_j)$ on the wafer when the defocus is $z_q$. The inequalities are reversed for a negative photoresist. Since the squared terms in Equation 4 are summed over target points $(x_j, y_j); j=1, \ldots, M$ and focus values $z_1, \ldots, z_Q$, resist edges go through all M target points, for all Q focus values if and only if $F_1m=0$. In practice, $F_1m=0$ is usually not feasible; therefore the photomask is designed by minimizing $F_1m$. This description embodies the special case Q=1 where Equation 4 is evaluated for a single focus value, such as the best focus, z=0. Using a single focus value reduces the computation time. The target points are points selected on the edges of the target polygons. The image intensity is band-limited with a Nyquist sampling rate of $0.25\lambda$/NA where $\lambda$ is the exposure wavelength and NA is the numerical aperture. Since the image is band-limited, placing the target points arbitrarily densely increases computational time with little benefit. A preferred value for the spacing of target points on an edge is $\sim 0.2\lambda$/NA. Not placing target points on corners of target polygons is good practice since resist edge cannot have sharp corners.

All three goals previously mentioned can be achieved by minimizing $F_2m$ with respect to lithography data (mask transmission function) m:

$$F_2m = \sum_{q=1}^{Q} \sum_{j=1}^{M} \frac{(I(x_j, y_j; z_q) - t)^2 + \alpha}{\left(tol_j \frac{\partial I}{\partial n}(x_j, y_j; z_q)\right)^2} \qquad (5)$$

$F_2$ is a functional that maps a mask transmission function m to a non-negative real number, which is a figure-of-demerit. Minimizing $F_2m$ forces the resist edge to go through the target points $(x_j, y_j); j=1, \ldots, M$ for focus values $z_1, \ldots, z_Q$. The image-slope $$\frac{\partial I}{\partial n}(x_j, y_j; z_q)$$

is the directional derivative of the image in the direction that is perpendicular to the target edge. The following term is a first-order estimate of the edge-placement error (EPE):

$$EPE_{j,q} \equiv \text{Edge placement error at } (x_j, y_j; z_q) = \frac{(I(x_j, y_j; z_q) - t)}{\frac{\partial I}{\partial n}(x_j, y_j; z_q)} \qquad (6)$$

The edge placement error is normalized with the edge placement tolerance $tol_j$ for the $j^{th}$ target point:

$$\text{Relative edge placement error at } (x_j, y_j; z_q) = \qquad (7a)$$
$$\frac{(I(x_j, y_j; z_q) - t)}{tol_j \frac{\partial I}{\partial n}(x_j, y_j; z_q)}$$

Edge placement error depends on the exposure dose. If the exposure dose is increased by $\Delta$dose, such that $|\Delta$dose/dose$| \ll 1$, then the edge placement error changes as follows:

$$EPE_{j,q}(\Delta\text{dose}) = \frac{I(x_j, y_j; z_q) - \left(1 - \frac{\Delta\text{dose}}{\text{dose}}\right)t}{\frac{\partial I}{\partial n}(x_j, y_j; z_q)} \qquad (7b)$$

If the sum of $[EPE_{jq}^2(+\Delta\text{dose}) + EPE_{jq}^2(-\Delta\text{dose})]/tol_j^2$ over all target points is minimized, then the figure-of-demerit $F_2m$ in Equation 5 is derived as follows:

$$F_2m = \sum_{q=1}^{Q} \sum_{j=1}^{M} \frac{(I(x_j, y_j; z_q) - t)^2 + \left(\frac{\Delta\text{dose}}{\text{dose}}t\right)^2}{\left(tol_j \frac{\partial I}{\partial n}(x_j, y_j; z_q)\right)^2} \qquad (7c)$$

This determines the value of the parameter $\alpha$ as:

$$\alpha = \left(\frac{\Delta\text{dose}}{\text{dose}}t\right)^2 \qquad (7d)$$

As an alternatively approach, the figure-of-demerit $F_2m$ in Equation 5 is achieved by introducing edge-displacement (ED) induced by dose-variation:

$$ED_{j,q}(\Delta\text{dose}) = \text{Edge displacement induced by dose} \qquad (7e)$$
$$\text{variation at } (x_j, y_j; z_q)$$
$$= \frac{\frac{\Delta\text{dose}}{\text{dose}}t}{\frac{\partial I}{\partial n}(x_j, y_j; z_q)}$$

If the sum of $[EPE_{jq}^2 + ED_{jq}^2(\Delta\text{dose})]/tol_j^2$ over all target points is minimized, then again the figure-of-demerit $F_2m$ in Equation 5 is derived, with the value of the parameter $\alpha$ given by Equation (7d).

Minimizing a sum-of-squares as indicated by Equation 4 or Equation 5 is convenient for optimization because it leads to a figure-of-demerit that is continuously differentiable with respect to the movements of the polygon edges or with respect to the value of the mask function in any neighborhood. Many other formulations of figure-of-demerit can be used although they are not preferred. Some examples of alternative figure-of-demerit formulations are given as follows:

$$F_3m = \max_{j,q} \frac{EPE_{jq}}{tol_j} \qquad (7f)$$

$$F_4 m = \sum_{q=1}^{Q} \sum_{j=1}^{M} \frac{|EPE_{jq}| + |ED(\Delta\text{dose})|}{tol_j} \quad (7g)$$

By virtue of having the image slope in the denominator, minimizing the figure-of-demerit $F_2 m$ enforces having a high image contrast at each target point. The optional, positive parameter $\alpha$ in the numerator of Equation 5 is used to emphasize the requirement of large image slope at the edges of the target polygons.

A high image slope increases the dose latitude and decreases the sensitivity of the printed pattern to lens flare (scattered light). The terms in Equation 5 are summed over the target points and over a few focus settings $z_1, z_2, \ldots, z_Q$. Typically using two focus settings such as $z=0$ (best focus) and $z=$(depth of focus)/2 is sufficient. A single focus value such as the best focus $z=0$ may be used to reduce the computation time.

Minimizing Fm forces the resist edge to go through the target points but that does not preclude presence of resist edges where there are no target points. Without additional constraints, minimizing the figure-of-demerit in Equation 4 or Equation 5 can result in spurious resist features in large clear areas, away from the target points. It can also cause spurious holes in large resist areas away from the target points. Additional constraints may be needed when the target pattern has large clear or large opaque features:

$I(x_j^{(c)}, y_j^{(c)}; z_q) \geq t_U > t$ for $(x_j^{(c)}, y_j^{(c)})$ in clear areas and opaque assist features $I(x_j^{(c)}, y_j^{(c)}; z_q) \leq t_L < t$ for $(x_j^{(c)}, y_j^{(c)})$ in opaque areas and clear assist features (8)

The control points $(x_j^{(c)}, y_j^{(c)})$ are placed where resist edges are not wanted, that is, anywhere other than the edges of the target polygons. In particular, control points may be placed on assist features and in between features where the process window is likely to be narrow. Constraint Equation 8 assumes a positive photoresist. For negative photoresists, the words opaque and clear are to be interchanged. The intensity safety margins $t_U$ and $t_L$ are determined by the desired dose latitude. Typical spacing of the control points is $0.25\lambda/NA$. The functional $F_1 m$ or $F_2 m$ is minimized subject to the constraints Equation 8.

The image intensity at a point is a quadratic functional of the mask function according to Equation 3. The figure-of-demerit in turn is a simple function (quadratic in the case of Equation 4 and rational polynomial in the case of Equation 5) of the intensity. The variation of the figure-of-demerit in Equation 4 with respect to changes in the mask function is:

$$\frac{\delta F_1 m}{\text{Re}\delta m}(x'', y'') = \quad (9)$$

$$4\sum_{q=1}^{Q} \sum_{j=1}^{M} (I(x_j, y_j; z_q) - t) \sum_{n=1}^{N} \mu_n \text{Re}\{Q_{nj} V_n^*(x'' - x_j, y'' - y_j; z_q)\}$$

$$\frac{\delta F_1 m}{\text{Im}\delta m}(x'', y'') = -4\sum_{q=1}^{Q} \sum_{j=1}^{M} (I(x_j, y_j; z_q) - t)$$

$$\sum_{n=1}^{N} \mu_n \text{Im}\{Q_{nj} V_n^*(x'' - x_j, y'' - y_j; z_q)\}$$

$$Q_{nj} = \int\int V_n(x' - x_j, y' - y_j; z) m^*(x', y') dx' dy'$$

The first and second lines in Equation 9 express the rate of change of the figure-of-demerit with respect to the real and imaginary parts of the mask function, respectively, at an arbitrary point $(x'', y'')$ on the mask. The points $(x_j, y_j); j=1, \ldots, M$ above are target points selected on target polygons. Moving an edge AB of the polygon $P_0$ by an amount $\Delta_{AB}$ to A'B', as shown in FIG. 2, changes the value of the mask function only in the region AA'B'B. For a piecewise-constant mask function, the value of the mask function at any point in AA'B'B changes by:

$\Delta m = m(\text{inside } P_0) - m(\text{outside } P_0)$ (10)

Consider an infinitesimal segment of an edge, the segment that is centered at $(x'', y'')$ and of length dl. The derivative of the figure-of-demerit with respect to the movement $\Delta$ of the infinitesimal segment per segment length is:

$$\Psi(x'', y'') \equiv \frac{\partial F_1 m}{dl \partial \Delta} = 4\sum_{q=1}^{Q} \sum_{j=1}^{M} (I(x_j, y_j; z_q) - t) \quad (11)$$

$$\sum_{n=1}^{N} \mu_n \text{Re}\{\Delta m(x'', y'') Q_{nj} V_n^*(x'' - x_j, y'' - y_j; z_q)\}$$

The function $\Psi$, defined on the edges of polygons in a mask layout, is the point-wise sensitivity of the figure-of-demerit to the movement of a point on a polygonal edge. The derivative of the figure-of-demerit with respect to the movement $\Delta_{AB}$ of the entire edge AB as one unit is:

$$\frac{\partial F_1 m}{\partial \Delta_{AB}} = \int_{AB} \Psi(x'', y'') dl'' 4 \sum_{q=1}^{Q} \sum_{j=1}^{M} (I(x_j, y_j; z_q) - t) \quad (12)$$

$$\sum_{n=1}^{N} \mu_n \int_{AB} \text{Re}\{\Delta m(x'', y'') Q_{nj} V_n^*(x'' - x_j, y'' - y_j; z_q)\} dl''$$

The line-integral above is taken over the edge AB. The double prime on dl" indicates the variables of integration are $(x'', y'')$. The derivative of the figure-of-demerit $F_2 m$ in Equation 5 is calculated similarly.

The array (vector) of available edge movements, is defined as $\Delta$. Some edges in the mask layout may not be movable; in which case, they are excluded from the array $\Delta$. For example, edges that have been optimized in a previous process may be marked as not movable in a subsequent process. The design of the mask layout is reduced to minimizing a figure-of-demerit such as $F_1 m$ in Equation 4 or $F_2 m$ in Equation 5 with respect to the vector $\Delta$. Standard techniques of optimization, such as the Gauss-Newton algorithm (See: Gill, Murray and Wright, Practical Optimization, Elsevier, 1986) can be used to minimize the figure-of-demerit. Explicitly calculating the derivative of the figure of merit as in Equation 12 makes the numerical implementation of the optimization algorithm more efficient. Calculating the derivative of the figure-of-demerit explicitly comprises: taking the derivative of the figure-of-demerit with respect to the image intensity analytically; and calculating the derivative of the image intensity in Equation (3) with respect to the mask function analytically. Evaluating a finite-difference of the figure-of-demerit in response to moving a segment of an edge is not considered explicit calculation of the derivative.

To describe the use of the Gauss-Newton algorithm in this context, a vector-valued, multi-variate function f(Δ) is introduced. In the case of the figure-of-demerit defined by Equation 4, the j, $q^{th}$ entry of vector f(Δ) is:

$$f_{jq}(\Delta) = I(x_j, y_j; z_q) - t \tag{13}$$

The function f: $R^N \rightarrow R^{QM}$ maps $\Delta \in R^N$, the array of N edge movements, into a vector of QM real numbers. M is the number of target points; and Q is the number of focus values, which can be 1. Similarly, for the figure-of-demerit defined by Equation 5, the j, $q^{th}$ entry of vector f(Δ) is:

$$f_{jq}(\Delta) = \frac{I(x_j, y_j; z_q) - t}{tol_j \frac{\partial I}{\partial n}(x_j, y_j; z_q)} \quad \text{for } \alpha = 0 \tag{14}$$

For convenience, we shall collapse the two indices of $f_{jq}(\Delta)$ into one. In other words, we are going to re-arrange f(Δ) into a column-vector and refer to the $p^{th}$ entry of this column vector as $f_p(\Delta)$. We define the Jacobian matrix J by:

$$J_{pq}(\Delta) \equiv \frac{\partial f_p}{\partial \Delta_q} = \sum_{n=1}^{N} \mu_n \int_{AB} \text{Re}\{\Delta m(x'', y'') Q_{nj} V_n^*(x'' - x_j, y'' - y_j; z_q)\} dl'' \tag{15}$$

Unconstrained minimization of the figure-of-demerit by the Gauss-Newton algorithm leads to the following iteration, where the superscript$^{(n)}$ is the iteration index:

$$J(\Delta^{(n)})[\Delta^{(n)} - \Delta^{(n+1)}]^{LSQ} = f(\Delta^{(n)}) \tag{16}$$

The linear Equation 16 is solved in the least-squares sense, taking into account the possibility that the rank of the matrix $J(\Delta^{(n)})$ can be less than the number of its columns to working precision. In that case, Equation 16 needs to be regularized, which can be done by the singular value decomposition or QR-factorization of $J(\Delta^{(n)})$ (See: G. H. Golub, C. F. Van Loan, *Matrix Computations*, Sect. 5.2, Johns Hopkins University Press, Baltimore, 1996), or by solving:

$$\Delta^{(n)} - \Delta^{(n+1)} = [J^T J + \epsilon I]^{-1} J^T f(\Delta^{(n)}) \tag{17}$$

In Equation 17, ε is a small, positive regularization parameter and I is the identity matrix. The method of Equation 17 is not preferred because it is inefficient. A preferred method of solving Equation 16 is the least-squares algorithm described in: C. C. Paige and M. A. Sunders, ACM Trans. Math. Software, Vol. 8, No. 2, June 1982, p. 195-209, which is hereby incorporated by reference in its entirety as though fully set forth herein.

Equation 16 is iterated until the figure-of-demerit is sufficiently small, or $\Delta^{(n)}$ ceases to change significantly, or a predetermined number of iterations or computation time is reached.

Figure 5:
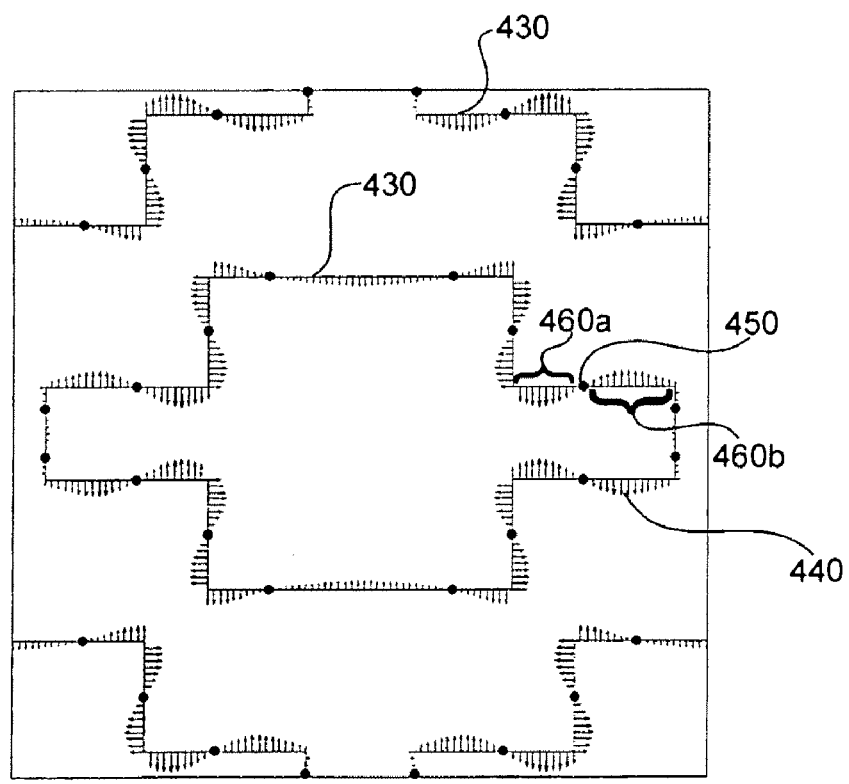
FIG. 5 is a diagrammatic illustration of a mask layout wherein the edge movements of the polygons are optimized without segmenting the edges.

Considering now the optimal segmentation of edges relative to FIG. 4, FIG. 4 shows a mask layout 412 in which a target pattern 410 is the unit cell of a periodically repeating pattern. The resist pattern 420 corresponds to the mask layout 430 in FIG. 5. The mask layout 430 was initially set to the target pattern and the edge movements were optimized without segmenting the edges. At the end of the optimization, the derivative with respect to the movement of the $j^{th}$ edge, $$\frac{\partial F_1 m}{\partial \Delta_j},$$

is zero in mask layout 430. This necessarily means $$\Psi(x'', y'') \text{ in } \frac{\partial F_1 m}{\partial \Delta_j} = \int_{EDGE_j} \Psi(x'', y'') dl''$$

changes its sign at least once on the $j^{th}$ edge. Arrows 440 in FIG. 5 show the magnitude and sign of Ψ(x", y"). Moving an infinitesimal line segment in the direction of its arrow will decrease the figure-of-demerit. The sign of Ψ(x", y"), hence the direction of the arrows, changes at a point 450 on edge 460. Segmenting edge 460 at the point 450 will create segments 460a and 460b. Moving these segments in opposite directions will most rapidly decrease the figure-of-demerit. The point-wise derivative with respect to edge movement, Ψ(x", y"), is uni-polar on segment 460a or 460b. Segmentation point 450 is optimal in the sense that it is the unique point that maximizes $$\max_{j=760a, 760b} \left| \frac{\partial F_1 m}{\partial \Delta_j} \right|,$$

that is, the absolute value of the derivative with respect to the movement of either segment 460a or 460b, whichever is greater. All edges in FIG. 5 are similarly segmented at the points indicated by black dots. In the subsequent step, the movements of the edge segments are optimized.

Figure 6:
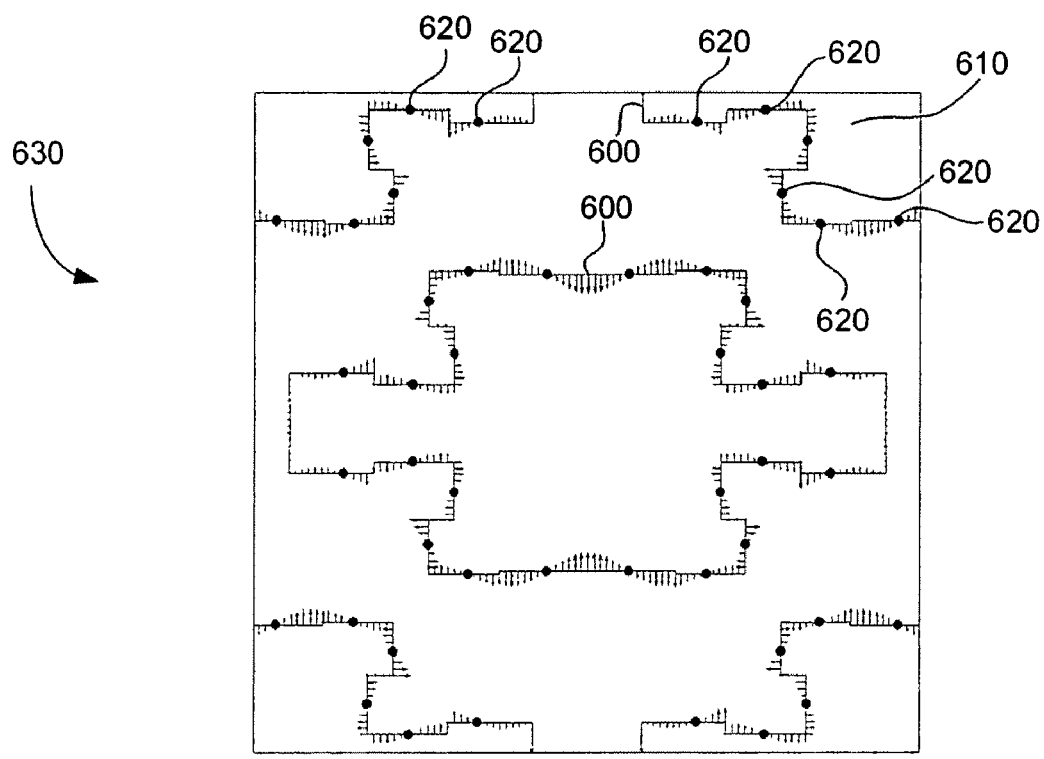
FIG. 6 is a diagrammatic illustration of the mask layout wherein the edge movements of the polygons are optimized after segmenting the edges of the mask layout of FIG. 5.

FIG. 6 shows the optimized edges 600, and the point-wise derivative 610 of the figure-of-demerit with respect to the edge movement, Ψ(x", y"), for the newly optimized edges in the mask layout 630. The segmentation points 620 for the next iteration are indicated by black dots.

Figure 7:
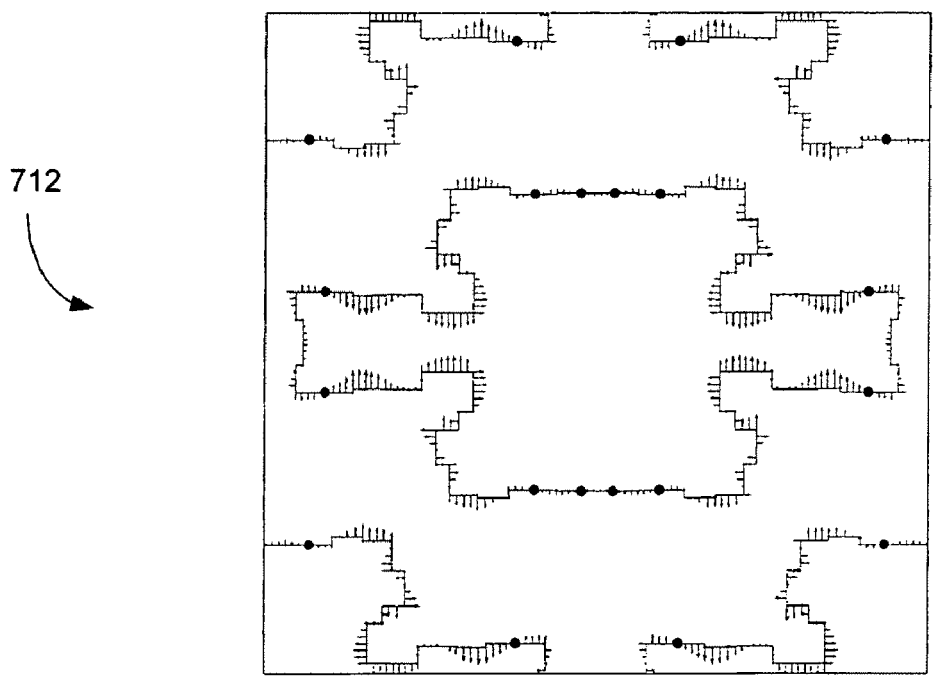
FIG. 7 is a diagrammatic illustration of the mask layout wherein the edge movements of the polygons are optimized after segmenting the edges of the mask layout of FIG. 6.
Figure 8:
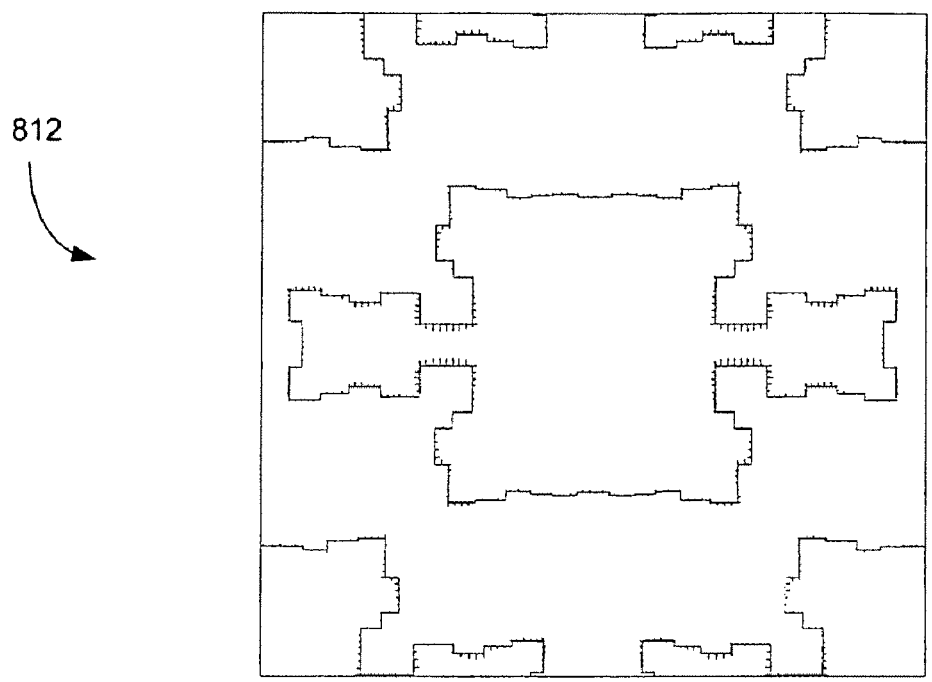
FIG. 8 is a diagrammatic illustration of the mask layout wherein the edge movements of the polygons are optimized after segmenting the edges of the mask layout of FIG. 7.
Figure 9:
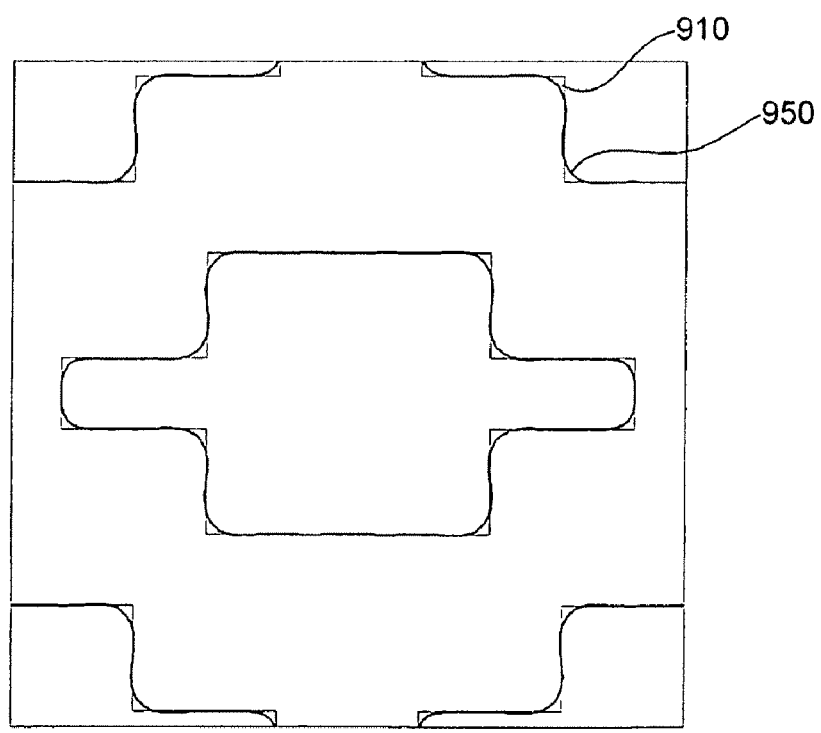
FIG. 9 is a diagrammatic illustration of the edges of a photoresist image in the plane of the wafer corresponding to the mask layout of FIG. 8.

FIG. 7 and FIG. 8 show subsequent layout iterations 712 and 812 respectively of the algorithm. At each step, the edge movements are optimized with the current segmentation. Once the edge movements are optimized, moving edges can no more decrease the figure-of-demerit without further segmenting the edges. The point-wise derivative of the figure-of-demerit with respect to the edge movement is calculated; points at which it changes sign are selected as the next segmentation points; and the cycle is repeated until design goals are met, or the figure of merit cannot be further decreased, or a predetermined number of cycles are completed. FIG. 9 shows the target polygons 910 and the resulting resist pattern 950.

Figure 10:
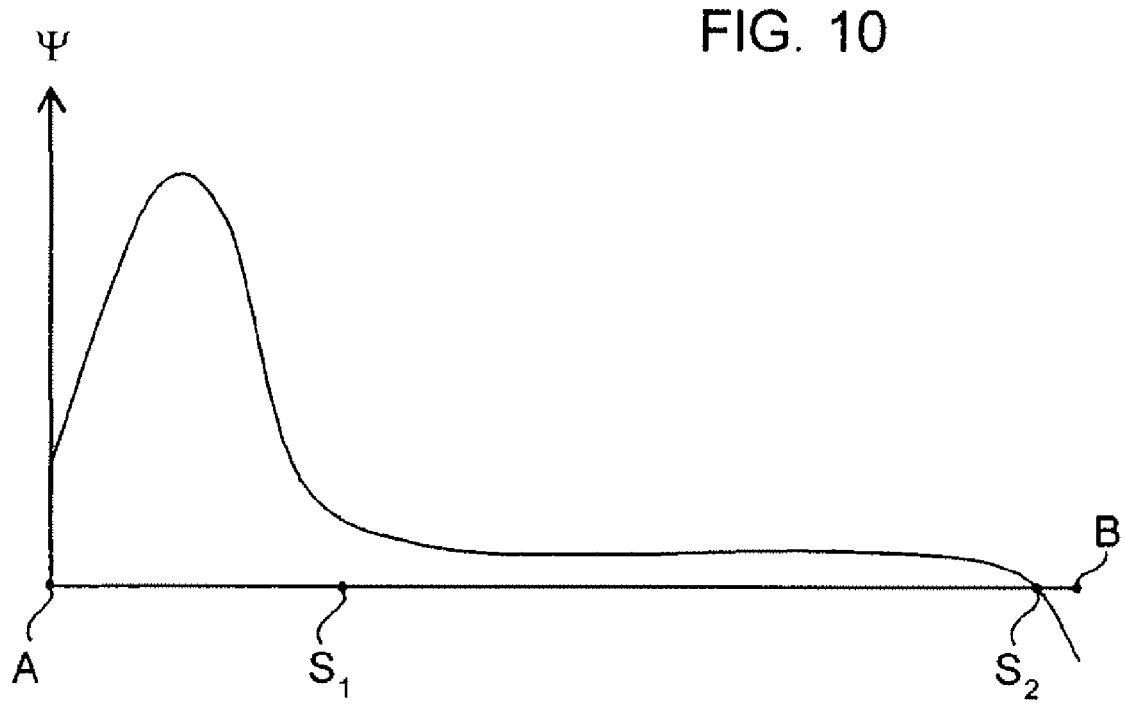
FIG. 10 is a graph where the ordinate is a point-wise derivative of a figure-of-merit of a mask layout with respect to edge movements, and the abscissa is indicative of a position along an edge of a polygon in the mask layout.

All points at which Ψ(x",y") changes are not necessarily accepted as segmentation points. FIG. 10 shows a graph 1012 of Ψ(x", y"), the point-wise derivative of the figure-of-demerit with respect to the edge movement. Segmentation at $S_2$ may be rejected if either: the segment $S_2B$ is too short for the mask writing or inspection tools; or the integral of Ψ(x", y") over $S_2B$ is insignificant. Conversely, segmentation points may be placed where Ψ(x", y") does not change its sign, such as at $S_1$, if $$\int_{AS_1} |\Psi(x'', y'')| d\ell''$$

is a disproportionately large fraction of $$\int_{AS_2} |\Psi(x'', y'')| d\ell''.$$

Figure 11:
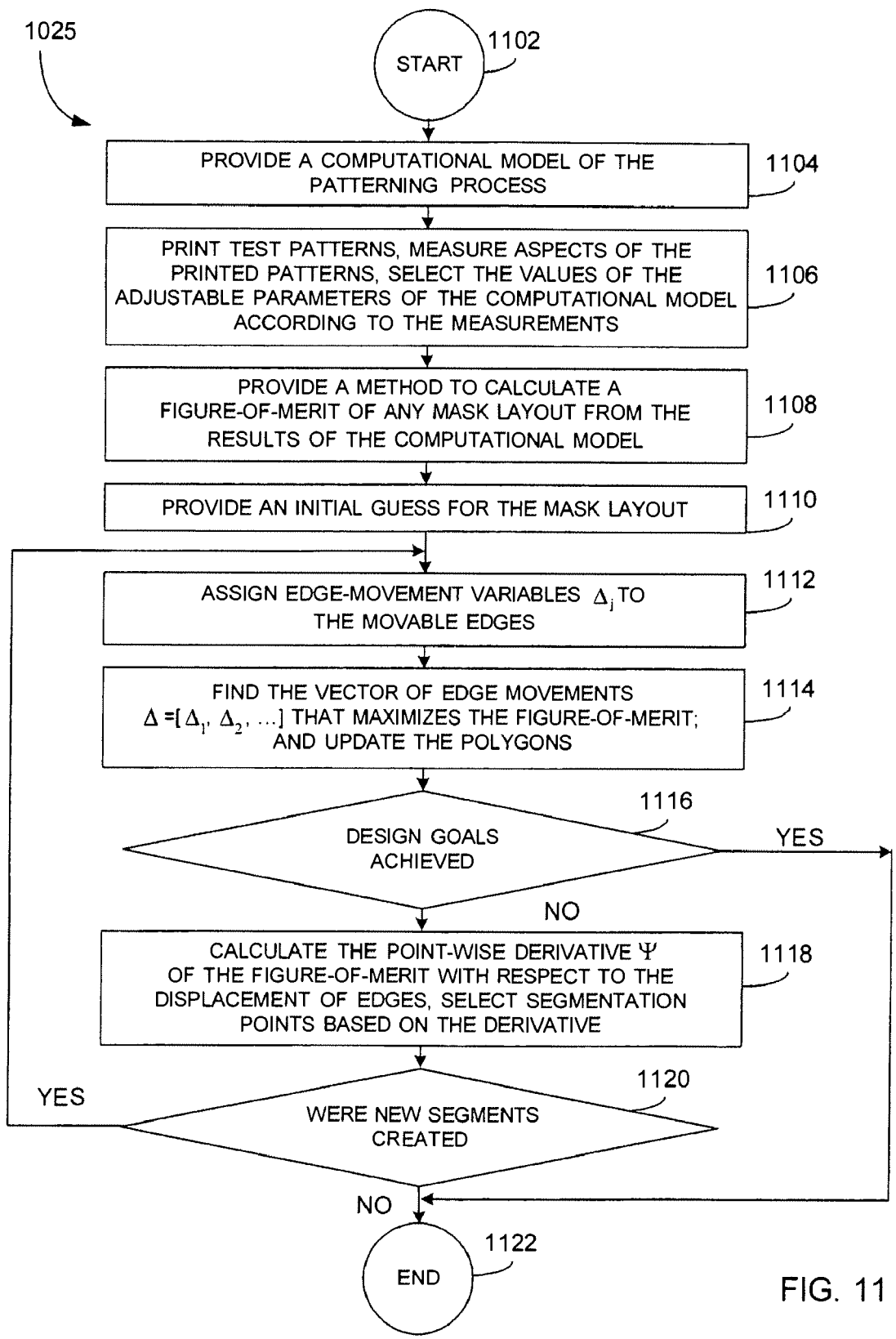
FIG. 11 is a flow diagram of a preferred embodiment of the present invention.

Referring to the flowchart in FIG. 11, the steps of the method 1025 of the preferred embodiment are illustrated. The method begins at a start step 1102 and proceed to step 1104. Step 1104 causes a computational model of the patterning process to be provided possibly with some adjustable parameters that are to be determined empirically.

From step 1104, the process continues to step 1106. Step 1106 causes a series of actions including: to print test patterns, to measure aspects of the printed patterns, to select the values of the adjustable parameters of the computational model such that a norm of the differences between the measured aspects and the aspects of the pattern predicted by the computational model is minimized.

Next step 1108 provides a method to calculate a figure-of-merit of the mask layout from the results of the computational model of the patterning process. The method to calculate the figure-of-merit is repeatedly used in the subsequent steps. The figure of merit measures how well the mask layout satisfies a design goal or a desired compromise between multiple goals. Steps 1104-1108 usually involve human action in the fabrication process such as printing wafers and performing metrology on the test patterns.

The method continues to step 1110, by providing an initial guess for the mask layout. For binary and attenuated-PSM masks, the initial guess can be the same as the target layout. The initial guess for the mask layout is not segmented.

Advancing to a command step 1112, the method assigns or updates the assignment of edge-movement variables $\Delta_j$, j=1, 2 ... to the movable edges of the polygons in the mask layout.

Continuing to a command step 1114, the method finds the vector of edge movements $\Delta = [\Delta_1, \Delta_2, \ldots]$ that maximizes the figure-of-merit, for example, according to Equation 16; and updates (transforms) the polygons in the mask layout accordingly by moving edges, as shown in FIG. 2, according to the entries of the vector $\Delta = [\Delta_1, \Delta_2, \ldots]$.

Next at a decision step 1116, the method proceeds to an end command 1122 if the design goals are met, i.e., figure-of-merit is greater than or equal to a predetermined number, or a predetermined number of iterations are reached.
In this regard, if design goals are achieved in a first iteration, polygon edges are moved without segmentation. Otherwise, the method proceeds to a command step 1118. As will be explained hereinafter in greater detail, if design goals are not achieved in the first iteration, then edge segmentation will occur in at least one of the subsequent iterations.

At command step 1118, the method calculates the derivative of the figure-of-merit with respect to the displacement of infinitesimal segments of edges at many points along each edge; finds the points on the edges at which the derivative changes its sign, or where the magnitude of the derivative significantly changes; and selects a subset of such points as segmentation points according to predetermined rules.

Next, the method proceeds to a decision step 1120 to determine whether any new segments were created as a result of the command step 1118. If not, the method proceeds to the end command 1122, otherwise, the method returns to step 1112 and proceeds as previously described.

Since the overall algorithm passes through 1114 multiple times, computation time may be saved by terminating the optimization algorithm at 1112 before it converges, at least on some of the passes.

This invention is not limited to correcting the optical proximity effect. The figure-of-demerit can be calculated using a computational model of patterning including any combination of: mask writing, optical image formation, resist blur, resist dissolution, and wafer etch effects. Then, the point-wise derivative of the figure-of-demerit with respect to the edge movement, $\Psi$, will indicate the optimal segmentation according to the physical effects included in the computational model.

Considering now the computer program product 70, in greater detail with reference to FIGS. 1 and 11, the computer program product 70 is a computer usable medium that has encoded thereon computer readable codes. The computer readable codes enable a user, via the CAD system 10, to implement a optical proximity correction and, more specifically, a method of photomask design that segments polygon edges optimally in a lithographic process. In this regard, the computer program product 70 has encoded thereon computer readable program code that causes the computer 30 in one preferred method 1025 to segment polygon edges so that moving each segment will have the greatest possible effect on a figure-of-merit in a photomask layout.

Considering the preferred method 1025 in still greater detail, the resulting movement of polygon edges is minimized. In this regard, effective correction is obtained by smaller edge movements, which reduces the tendency of polygons to bridge or pinch out, which would otherwise activate mask constraints and lead to sub-optimal mask design.

Considering the preferred method 1025 in still yet greater detail, the segmentation is determined according to a computational model of a physical patterning process, not according to ad hoc rules. Moreover, the segmentation is not done once (although that is a sub-optimal embodiment) but instead progressively and adaptively as the polygon edges move. In this regard, the edges are moved, segmented, moved, segmented, moved, and so on. Each step of moving the edges and segmenting the edges is optimally done; that is, by minimizing a mathematical expression of a figure-of-merit.

In the preferred embodiment, the computer readable code has been described as being encoded on a disc 70 that can be entered into the computer memory 40 by the disc drive 22, which reads and transfers the code under computer control. However, it is contemplated that the code could be entered remotely from another computer, through a high speed cable or satellite connection, or directly from or any other input device that is capable of communication with the computer 30. Therefore, while a particular embodiment of the present invention has been disclosed, it is to be understood that various different modifications are possible and are contemplated within the true spirit and scope of the appended claims. There is no intention, therefore, of limitations to the exact abstract or disclosure herein presented.

We claim:

1. A method of altering a photomask data set, the method comprising:
   providing a computational model of the patterning process;
   defining a set of design goals;
   providing a method of calculating a figure-of-merit indicative of how well any photomask data set meets said design goals according to said computational model, wherein the method uses a functional based on the computational model to map the photomask data set to the figure-of-merit, and wherein the functional is a mathematical map of a topological vector space to a corresponding scalar field; and using a computer to modify the photomask data set in a way that increases its figure-of-merit.

2. The method of photomask design according to claim 1, wherein the design goals of a desired photomask design include at least one of the following: substantially minimizing a difference between a target pattern and a printed pattern as predicted by said computational model; substantially maximizing the image contrast at a resist edge; and substantially maximizing a depth of focus.

3. The method of photomask design according to claim 2, wherein said steps of minimizing and maximizing are achieved by adjusting the photomask data set in a way that decreases the expression of the functional:

$$\sum_{q=1}^{Q} \sum_{j=1}^{M} (I(x_j, y_j; z_q) - t)^2$$

wherein j is an index that labels target points; M is the number of target points; $(x_j, y_j)$ are the coordinates of the j-th target point on the plane of the photomask; q is an index that labels defocus values: $z_q$ is the q-th defocus value; Q is the number of defocus values which can be unity; t is a threshold; $I(x_j, y_j; z_q)$ is the image intensity calculated according to a computational model of imaging at a target point $(x_j, y_j)$, for the defocus value $z_q$.

4. The method of photomask design according to claim 2, wherein said steps of minimizing and maximizing are achieved by adjusting the photomask data set in a way that decreases the expression of the functional:

$$\sum_{q=1}^{Q} \sum_{j=1}^{M} \frac{(I(x_j, y_j; z_q))^2 + \alpha}{\left(tol_j \frac{\partial I}{\partial n}(x_j, y_j; z_q)\right)}$$

wherein j is an index that labels target points; M is the number of target points; $(x_j, y_j)$ are the coordinates of the j-th target point on the plane of the photomask; q is an index that labels defocus values; $z_q$ is the q-th defocus value; Q is the number of defocus values which can be unity; t is a threshold; $I(x_j, y_j; z_q)$ is the image intensity calculated according to a computational model of imaging at a target point $(x_j, y_j)$ for the defocus value $z_q$; and wherein the term $$\frac{\partial I}{\partial n}(x_j, y_j; z_q)$$

is the directional derivative of the image intensity in a direction n that is substantially perpendicular to an edge of a target pattern; $tol_j$ is a tolerance parameter for the j-th target point and a is a positive parameter.

5. The method of photomask design according to claim 2, further comprising:

selecting a set of control points in regions where a negative photoresist is required to remain substantially intact upon development; and enforcing the constraint: $I \geq t_U$ to at each control point; wherein $t_U$ is a number that is greater than the ratio (dose-to-clear/dose); and I is the image intensity calculated according to said computational model.

6. The method of photomask design according to claim 2, further comprising:

selecting a set of control points in regions where a positive photoresist is required to clear upon development; and enforcing the constraint: $I \geq t_L$ at each control point; wherein $t_L$ is a number that is less than the ratio (dose-to-clear/dose); and I is the image intensity calculated according to said computational model at the control point.

7. The method of photomask design according to claim 2, further comprising:

selecting a set of control points in regions where a positive photoresist is required clear upon development; and enforcing a constraint: $I \geq t_U$ at each control point; wherein $t_U$ is a number that is greater than the ratio (dose-to-clear/dose); and I is the image intensity calculated according to said computational model.

8. The method of photomask design according to claim 2, further comprising:

selecting a set of control points in regions where a positive photoresist is required to remain substantially intact upon development; and enforcing the constraint: $I \geq t_L$ at each control point; wherein $t_L$ is a number that is less than the ratio (dose-to-clear/dose); and I is the image intensity calculated according to said computational model at the control point.

9. A method of altering a photomask data set, the method comprising:

providing a computational model of the patterning process;

defining a set of design goals;

providing a method of calculating a figure-of-demerit indicative of how well any photomask data set meets said design goals according to said computational model, wherein the method uses a functional based on the computational model to map the photomask data set to the figure-of-demerit, and wherein the functional is a mathematical map of a topological vector space to a corresponding scalar field; and using a computer to modify the photomask data set in a way that decreases its figure-of-demerit.

10. The method of photomask design according to claim 9, wherein said computational model of a desired patterning process includes adjustable parameters with empirically determined values.

11. A method of modifying a mask data set, comprising:

providing a computational model of pattern-transfer from a photomask to a wafer;

selecting a value for said at least one adjustable parameter of said computational model such that a norm of the difference between a measured aspect and a predicted aspect is minimized;

providing a method to calculate a figure-of-merit for a resulting pattern predicted by said computational model, wherein the method uses a functional based on the computational model to map the photomask data set to the figure-of-merit, and wherein the functional is a mathematical map of a topological vector space to a corresponding scalar field;

providing an initial mask data set defined by a set of polygons;

assigning an edge movement variable to each movable edge in said set of polygons;

using a computer to iteratively determine a set of edge movements which increases said figure-of-merit; and stopping when any one of the following conditions occurs:
the figure-of-merit is sufficiently increased;
the figure-of-merit does not significantly change; or
a predetermined number of iterations is reached.

12. The method of modifying a mask data set according to claim 11, further comprising:
calculating the derivative of said figure-of-merit with respect to the displacement of infinitesimal segments of edges at a plurality of points along each edge;
selecting segmentation points according to said derivative;
determining whether any new segments are created;
stopping if no new segments are created;
increasing the number of vertices of the polygons according to the segmentation points to form segmented polygons;
moving edges of the segmented polygons in a way that decreases said figure-of-merit; and
repeating the last mentioned steps of calculating, selecting, determining, stopping, increasing and moving a sufficient number of times to provide a set of optimized polygons.

13. A computer program product for altering a photomask data set, the computer program product comprising a non-transitory computer useable medium having computer readable code embedded thereon, the computer readable code configured to cause a computer system to perform the operations of:
receiving a computational model of the patterning process;
defining a set of design goals;
receiving a method of calculating a figure-of-merit indicative of how well any photomask data set meets said design goals according to said computational model, wherein the method uses a functional based on the computational model to map the photomask data set to the figure-of-merit, and wherein the functional is a mathematical map of a topological vector space to a corresponding scalar field; and
modifying the photomask data set in a way that increases its figure-of-merit.

14. The computer program product according to claim 13, wherein the design goals of a desired photomask design include at least one of the following: substantially minimizing a difference between a target pattern and a printed pattern as predicted by said computational model; substantially maximizing the image contrast at a resist edge; and substantially maximizing a depth of focus.

15. The computer program product according to claim 14, wherein said operations of minimizing and maximizing are achieved by adjusting the photomask data set in a way that decreases the expression of the functional:

$$\sum_{q=1}^{Q} \sum_{j=1}^{M} (I(x_j, y_j; z_q) - t)^2$$

wherein j is an index that labels target points; M is the number of target points; $(x_j, y_j)$ are the coordinates of the j-th target point on the plane of the photomask; q is an index that labels defocus values; $z_q$ is the q-th defocus value; Q is the number of defocus values which can be unity; t is a threshold; $I(x_j, y_j; z_q)$ is the image intensity calculated according to a computational model of imaging at a target point $(x_j, y_j)$, for the defocus value $z_q$.

16. The computer program product according to claim 14, wherein said operations of minimizing and maximizing are achieved by adjusting the photomask dataset in a way that decreases the expression of the functional:

$$\sum_{q=1}^{Q} \sum_{j=1}^{M} \frac{(I(x_j, y_j; z_q)^2 + \alpha}{\left(tol_j \frac{\partial I}{\partial n}(x_j, y_j; z_q)\right)}$$

wherein j is an index that labels target points; M is the number of target points; $(x_j, y_j)$ are the coordinates of the j-th target point on the plane of the photomask; q is an index that labels defocus values; $z_q$ is the q-th defocus value; Q is the number of defocus values which can be unity; t is a threshold; $I(x_j, y_j; z_q)$ is the image intensity calculated according to a computational model of imaging at a target point $(x_j, y_j)$ for the defocus value $z_q$; and wherein the term $$\frac{\partial I}{\partial n}(x_j, y_j; z_q)$$

is the directional derivative of the image intensity in a direction n that is substantially perpendicular to an edge of a target pattern; $tol_j$ is a tolerance parameter for the j-th target point and a is a positive parameter.

17. The computer program product according to claim 14, the operations further comprising:
selecting a set of control points in regions where a negative photoresist is required to remain substantially intact upon development; and
enforcing the constraint: $I \geq t_U$ to at each control point; wherein $t_U$ is a number that is greater than the ratio (dose-to-clear/dose); and I is the image intensity calculated according to said computational model.

18. The computer program product according to claim 14, the operations further comprising:
selecting a set of control points in regions where a positive photoresist is required to clear upon development; and
enforcing the constraint: $I \geq t_L$ at each control point; wherein $t_L$ is a number that is less than the ratio (dose-to-clear/dose); and I is the image intensity calculated according to said computational model at the control point.

19. The computer program product according to claim 14, the operations further comprising:
selecting a set of control points in regions where a positive photoresist is required clear upon development; and
enforcing a constraint: $I \geq t_U$ at each control point; wherein $t_U$ is a number that is greater than the ratio (dose-to-clear/dose) and I is the image intensity calculated according to said computational model.

20. The computer program product according claim 14 the operations further comprising:
selecting a set of control points in regions where a positive photoresist is required to remain substantially intact upon development; and
enforcing the constraint: $I \geq t_L$ at each control point; wherein $t_L$ is a number that is less than the ratio (dose-to-clear/dose); and I is the image intensity calculated according to said computational model at the control point.

21. A computer program product for altering a photomask data set, the computer program product comprising a non-transitory computer useable medium having computer readable code embedded thereon, the computer readable code configured to cause a computer system to perform the operations of:

receiving a computational model of the patterning process;

defining a set of design goals;

receiving a method of calculating a figure-of-demerit indicative of how well any photomask data set meets said design goals according to said computational model, wherein the method uses a functional based on the computational model to map the photomask data set to the figure-of-demerit, and wherein the functional is a mathematical map of a topological vectors space to a corresponding scalar field; and modifying the photomask data set in a way that decrease its figure-of-demerit.

22. The computer program product according to claim 21, wherein said computational model of a desired patterning process includes adjustable parameters with empirically determined values.

23. A computer program product for modifying a mask data set, the computer program product comprising a non-transitory computer useable medium having computer readable code embedded thereon, the computer readable code configured to cause a computer system to perform the operations of:

receiving a computational model of pattern-transfer from a photomask to a wafer;

selecting a value for said at least one adjustable parameter of said computational model such that a norm of the difference between a measured aspect and a predicted aspect is minimized;

receiving a method to calculate a figure-of-merit for a resulting pattern predicted by said computational model, wherein the method uses a functional based on the computational model to map the photomask data set to the figure-of-merit, and wherein the functional is a mathematical map of a topological vector space to a corresponding scalar field;

receiving an initial mask data set defined by a set of polygons;

assigning an edge movement variable to each movable edge in said set of polygons;

iteratively determining a set of edge movements which increases said figure-of-merit; and stopping when any one of the following conditions occurs:

the figure-of-merit is sufficiently increased;

the figure-of-merit does not significantly change; or a predetermined number of iterations is reached.

24. The computer program product according to claim 23, the operations further comprising:

calculating the derivative of said figure-of-merit with respect to the displacement of infinitesimal segments of edges at a plurality of points along each edge;

selecting segmentation points according to said derivative;

determining whether any new segments are created;

stopping if no new segments are created;

increasing the number of vertices of the polygons according to the segmentation points to form segmented polygons;

moving edges of the segmented polygons in a way that decreases said figure-of-merit; and repeating the last mentioned steps of calculating, selecting, determining, stopping, increasing and moving a sufficient number of times to provide a set of optimized polygons.

25. A computer-aided circuit design system comprising:

a processor;

a memory connected to the processor; and a computer useable medium having computer readable code embedded thereon, the computer readable code configured to cause the processor to perform the operations of:

receiving a computational model of the patterning process, defining a set of design goals, receiving a method of calculating a figure-of-merit indicative of how well any photomask data set meets said design goals according to said computational model, wherein the method uses a functional based on the computational model to map the photomask data set to the figure-of-merit, and wherein the functional is a mathematical map of a topological vector space to a corresponding scalar field, and modifying the photomask data set in a way that increases its figure-of-merit.

26. The computer-aided circuit design system according to claim 25, wherein the design goals of a desired photomask design include at least one of the following: substantially minimizing a difference between a target pattern and a printed pattern as predicted by said computational model; substantially maximizing the image contrast at a resist edge; and substantially maximizing a depth of focus.

27. The computer-aided circuit design system according to claim 26, wherein said operations of minimizing and maximizing are achieved by adjusting the photomask data set in a way that decreases the expression of the functional:

$$\sum_{q=1}^{Q} \sum_{j=1}^{M} (I(x_j, y_j; z_q) - t)^2$$

wherein j is an index that labels target points; M is the number of target points; $(x_j, y_j)$ are the coordinates of the j-th target point on the plane of the photomask; q is an index that labels defocus values; $z_q$ is the q-th defocus value; Q is the number of defocus values which can be unity; t is a threshold; $I(x_j, y_j; z_q)$ is the image intensity calculated according to a computational model of imaging at a target point $(x_j, y_j)$ for the defocus value $z_q$.

28. The computer-aided circuit design system according to claim 26, wherein said operations of minimizing and maximizing are achieved by adjusting the photomask data set in a way that decreases the expression of the functional:

$$\sum_{q=1}^{Q} \sum_{j=1}^{M} \frac{(I(x_j, y_j; z_q)^2 + \alpha}{\left(tol_j \frac{\partial I}{\partial n}(x_j, y_j; z_q)\right)}$$

wherein j is an index that labels target points; M is the number of target points; $(x_j, y_j)$ are the coordinates of the j-th target point on the plane of the photomask; q is an index that labels defocus values; $z_q$ is the q-th defocus value; Q is the number of defocus values which can be unity; t is a threshold; $I(x_j, y_j; z_q)$ is the image intensity calculated according to a computational model of imaging at a target point $(x_j, y_j)$ for the defocus value $z_q$; and wherein the term $$\frac{\partial I}{\partial n}(x_j, y_j; z_q)$$

is the directional derivative of the image intensity in a direction n that is substantially perpendicular to an edge of a target pattern; $tol_j$ is a tolerance parameter for the j-th target point and a is a positive parameter.

29. The computer-aided circuit design system according to claim 26, the operations further comprising:
selecting a set of control points in regions where a negative photoresist is required to remain substantially intact upon development; and
enforcing the constraint: $I \geq t_U$ to at each control point; wherein $t_U$ is a number that is greater than the ratio (dose-to-clear/dose); and I is the image intensity calculated according to said computational model.

30. The computer-aided circuit design system according to claim 26, the operations further comprising:
selecting a set of control points in regions where a positive photoresist is required to clear upon development; and
enforcing the constraint: $I \geq t_L$ at each control point; wherein $t_L$ is a number that is less than the ratio (dose-to-clear/dose); and I is the image intensity calculated according to said computational model at the control point.

31. The computer-aided circuit design system according to claim 26, the operations further comprising:
selecting a set of control points in regions where a positive photoresist is required clear upon development; and
enforcing a constraint: $I \geq t_U$ at each control point: wherein $t_U$ is a number that is greater than the ratio (dose-to-clear/dose); and I is the image intensity calculated according to said computational model.

32. The computer-aided circuit design system according to claim 26, the operations further comprising:
selecting use(of control points in regions where a positive photoresist is required to remain substantially intact upon development; and
enforcing the constraint: $I \geq t_L$ at each control point; wherein $t_L$ is a number that is less than the ratio (dose-to-clear/dose); and I is the image intensity calculated according to said computational model at the control point.

33. A computer-aided circuit design system comprising:
a processor;
a memory connected to the processor; and
a computer useable medium having computer readable code embedded thereon, the computer readable code configured to cause the processor to perform the operations of:
receiving a computational model of the patterning process;
defining a set of design goals;
receiving a method of calculating a figure-of-demerit indicative of how well any photomask data set meets said design goals according to said computational model, wherein the method uses a functional based on the computational model to map the photomask data set to the figure-of-demerit, and wherein the functional is a mathematical map of a topological vector space to a corresponding scalar field; and
modifying the photomask data set in a way that decrease its figure-of-demerit.

34. The computer-aided circuit design system according to claim 33, wherein said computational model of a desired patterning process includes adjustable parameters with empirically determined values.

35. A computer-aided circuit design system comprising:
a processor;
a memory connected to the processor; and
a computer useable medium having computer readable code embedded thereon, the computer readable code configured to cause a computer system to perform the operations of:
receiving a computational model of pattern-transfer from a photomask to a wafer;
selecting a value for said at least one adjustable parameter of said computational model such that a norm of the difference between a measured aspect and a predicted aspect is minimized;
receiving a method to calculate a figure-of-merit for a resulting pattern predicted by said computational model, wherein the method uses a functional based on the computational model to map the photomask data set to the figure-of-merit, and wherein the functional is a mathematical map of a topological vector space to a corresponding scalar field;
receiving an initial mask data set defined by a set of polygons;
assigning an edge movement variable to each movable edge in said set of polygons;
iteratively determining a set of edge movements which increases said figure-of-merit; and
stopping when any one of the following conditions occurs:
the figure-of-merit is sufficiently increased;
the figure-of-merit does not significantly change; or
a predetermined number of iterations is reached.

36. The computer-aided circuit design system according to claim 35, the operations further comprising:
calculating the derivative of said figure-of-merit with respect to the displacement of infinitesimal segments of edges at a plurality of points along each edge;
selecting segmentation points according to said derivative;
determining whether any new segments are created;
stopping if no new segments are created;
increasing the number of vertices of the polygons according to the segmentation points to form segmented polygons;
moving edges of the segmented polygons in a way that decreases said figure-of-merit; and
repeating the last mentioned steps of calculating, selecting, determining, stopping, increasing and moving a sufficient number of times to provide a set of optimized polygons.

* * * * *

UNITED STATES PATENT AND TRADEMARK OFFICE
CERTIFICATE OF CORRECTION

| | | |
|---|---|---|
| PATENT NO. | : 8,122,389 B2 | Page 1 of 1 |
| APPLICATION NO. | : 12/690791 | |
| DATED | : February 21, 2012 | |
| INVENTOR(S) | : Abdurrahman Sezginer et al. | |

It is certified that error appears in the above-identified patent and that said Letters Patent is hereby corrected as shown below:

Col. 21, line 37, please delete "use(of" and insert --a set of--.

Signed and Sealed this
Tenth Day of April, 2012

David J. Kappos
*Director of the United States Patent and Trademark Office*